US010391799B2

(12) United States Patent
Sago et al.

(10) Patent No.: US 10,391,799 B2
(45) Date of Patent: Aug. 27, 2019

(54) INKJET PRINTER AND INKJET PRINT HEAD

(71) Applicant: Roland DG Corporation, Hamamatsu-shi, Shizuoka (JP)

(72) Inventors: Ryota Sago, Hamamatsu (JP); Sachie Muroga, Hamamatsu (JP); Eiji Hanba, Hamamatsu (JP); Hironobu Suzuki, Hamamatsu (JP); Hideki Yagi, Hamamatsu (JP)

(73) Assignee: ROLAND DG CORPORATION, Shizuoka (JP)

( * ) Notice: Subject to any disclaimer, the term of this patent is extended or adjusted under 35 U.S.C. 154(b) by 0 days.

(21) Appl. No.: 16/006,909

(22) Filed: Jun. 13, 2018

(65) Prior Publication Data

US 2018/0361765 A1 Dec. 20, 2018

(30) Foreign Application Priority Data

Jun. 16, 2017 (JP) ................................ 2017-118509

(51) Int. Cl.
*B41J 2/14* (2006.01)
*B41J 2/37* (2006.01)
*B41J 2/045* (2006.01)
*H05K 7/20* (2006.01)
*B41J 29/377* (2006.01)

(52) U.S. Cl.
CPC ......... *B41J 29/377* (2013.01); *B41J 2/04515* (2013.01); *B41J 2/14* (2013.01); *B41J 2202/08* (2013.01)

(58) Field of Classification Search
CPC ........ B41J 29/377; B41J 2/04515; B41J 2/14; H05K 7/20
See application file for complete search history.

(56) References Cited

U.S. PATENT DOCUMENTS

2009/0267985 A1* 10/2009 Usui .................... B41J 2/04541 347/18
2010/0066785 A1* 3/2010 Yamada ................... B41J 2/175 347/18
2016/0193836 A1 7/2016 Moens et al.
2016/0243857 A1* 8/2016 Otsuka ................... B41J 29/377

FOREIGN PATENT DOCUMENTS

JP 05-259673 A 10/1993
JP 06-13364 U 2/1994
JP 2003-280101 A 10/2003
JP 2005-254619 A 9/2005
JP 2007-276174 A 10/2007

* cited by examiner

*Primary Examiner* — Jason S Uhlenhake
(74) *Attorney, Agent, or Firm* — Keating & Bennett, LLP

(57) ABSTRACT

A drive signal generator of an inkjet printer includes a first electronic component that generates a greater amount of heat than a second electronic component. A heat sink includes wall members and first and second ends. The wall members include first and second wall members having an outer wall. The heat sink has a tubular shape defined by the wall members and is open at the first and second ends. A portion of a cooling fan faces the first end of the heat sink, and another portion of the cooling fan protrudes at least from the first end toward the first wall member. The first electronic component is in contact with the outer wall of the first wall member, and the second electronic component is in contact with the outer wall of the second wall member.

14 Claims, 6 Drawing Sheets

INKJET PRINTER AND INKJET PRINT HEAD

CROSS REFERENCE TO RELATED APPLICATIONS

This application claims the benefit of priority to Japanese Patent Application No. 2017-118509 filed on Jun. 16, 2017. The entire contents of this application are hereby incorporated herein by reference.

BACKGROUND OF THE INVENTION

1. Field of the Invention

The present invention relates to inkjet printers and inkjet print heads.

2. Description of the Related Art

Heat sinks are conventionally used in various types of electronic devices to cool electronic components that generate a large amount of heat. For example, JP H05(1993)-259673 A discloses an angular cylindrical-shaped cooling structure in which heat dissipating fins are provided inside. Electronic components are intimately fitted on the back of the fins of the angular cylindrical-shaped cooling structure, and air is blown through the interior of the angular cylindrical-shaped cooling structure by a fan.

Inkjet printers also incorporate electronic components that generate a large amount of heat. Such electronic components may include, for example, transistors in drive signal generator circuits that generate drive signals for actuators. Within the drive waveform generator circuits, the transistors are provided in drive waveform amplifier circuits that amplify signal waveforms. In recent years, because of diversification of inks, higher printing density, and demands for high speed, the number of actuators in a print head has been increasing and the density thereof has accordingly been become higher. Consequently, a cooling device that cools electronic components typified by transistors is also required to have higher cooling capability. However, in order to enhance the cooling capability of the cooling device, it has been necessary with conventional techniques to enhance fins and/or cooling fans, which results in higher costs.

SUMMARY OF THE INVENTION

In view of the foregoing and other problems, preferred embodiments of the present invention provide inkjet printers and inkjet print heads each equipped with a cooling device that is able to cool electronic components more efficiently.

An inkjet printer according to a preferred embodiment of the present invention includes one or a plurality of heads including actuators that cause an ink to be ejected, one or a plurality of drive signal generators generating a drive signal that drives the actuator, and a cooling device. The drive signal generator includes a first electronic component and a second electronic component. The cooling device cools at least the first electronic component and the second electronic component. The first electronic component generates a greater amount of heat than the second electronic component when generating the drive signal. The cooling device includes a first heat sink and a first cooling fan. The first heat sink includes wall members, a first end, and a second end, the wall members including a first wall member and a second wall member each including an outer wall, the first heat sink having a tubular shape defined by the wall members and being open at the first end and the second end. The first cooling fan includes an inner air blowing portion, disposed so as to face the first end of the first heat sink, and an outer air blowing portion, disposed outwardly relative to the inner air blowing portion, and the first cooling fan directs air flow at least through an interior of the first heat sink and along the outer wall of the first wall member. The first electronic component is in contact with the outer wall of the first wall member, and the second electronic component is in contact with the outer wall of the second wall member.

An inkjet print head according to a preferred embodiment of the present invention includes one or a plurality of heads including actuators that cause an ejection fluid to be ejected, one or a plurality of drive signal generators generating a drive signal that drives the actuator, and a cooling device. The drive signal generator includes a first electronic component and a second electronic component. The cooling device cools at least the first electronic component and the second electronic component. The first electronic component generates a greater amount of heat than the second electronic component when generating the drive signal. The cooling device includes a heat sink and a cooling fan. The heat sink includes wall members, a first end, and a second end, the wall members including a first wall member and a second wall member each including an outer wall, the heat sink having a tubular shape defined by the wall members and being open at the first end and the second end. The cooling fan includes an inner air blowing portion, disposed so as to face the first end of the heat sink, and an outer air blowing portion, disposed outwardly relative to the inner air blowing portion, and the cooling fan directs air flow at least through an interior of the heat sink and along the outer wall of the first wall member. The first electronic component is in contact with the outer wall of the first wall member, and the second electronic component is in contact with the outer wall of the second wall member.

The inkjet printer and the inkjet print head are structured so that the first electronic component, which generates a greater amount of heat, is collectively disposed on the outer wall of the first wall member of the heat sink, and so that a portion of the cooling fan protrudes outwardly from the first wall member. Because the first transistor is cooled from both the outside and the inside of the heat sink, the first transistor is cooled more efficiently. On the other hand, the second electronic component, which generates relatively less heat, is basically cooled from the inside of the heat sink. Thus, the above-described preferred embodiments of the inkjet printers and the inkjet print heads achieve high cooling efficiency as a whole by bringing together the components that generate a relatively greater amount of heat and cooling them intensively.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
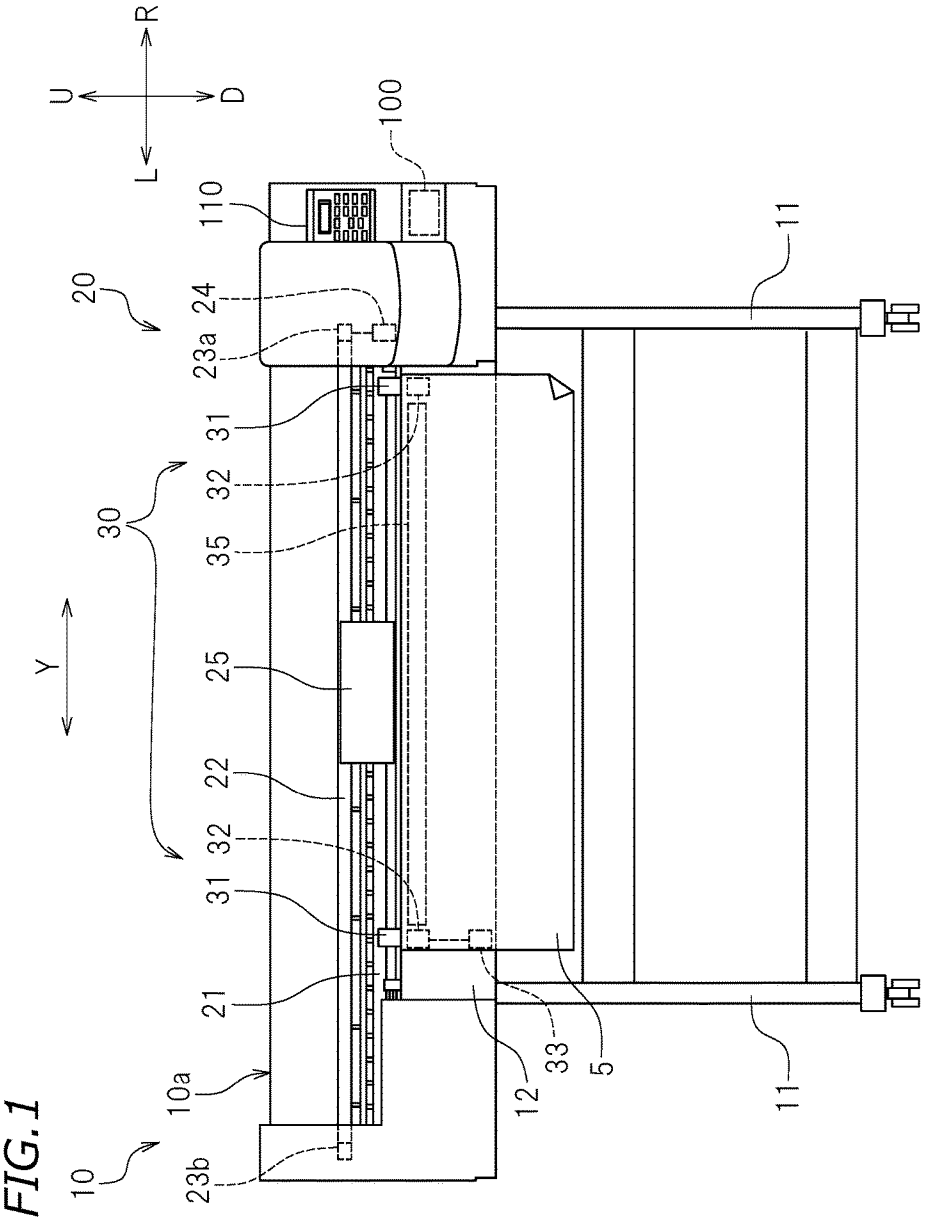
FIG. 1 is a front view illustrating an inkjet printer according to a preferred embodiment of the present invention.

Hereinbelow, inkjet printers according to some preferred embodiments of the present invention will be described with reference to the drawings. It should be noted, however, that the preferred embodiments described herein are, of course, not intended to limit the present invention. The features and components that exhibit the same effects are denoted by the same reference symbols, and repetitive description thereof may be omitted as appropriate. In the following description, with respect to the user standing in front of the inkjet printer, a direction toward the user relative to the inkjet printer is defined as "frontward", and a direction away from the user relative to the inkjet printer is defined as "rearward". In the drawings, reference character Y represents the main scanning direction, and reference character X represents the sub-scanning direction X that is orthogonal to the main scanning direction Y. Reference characters F, Rr, L, R, U, and D in the drawings represent front, rear, left, right, up, and down, respectively. These directional terms are, however, merely provided for convenience in description, and are not intended to limit in any way the manner in which the inkjet printer should be arranged.

Figure 2:
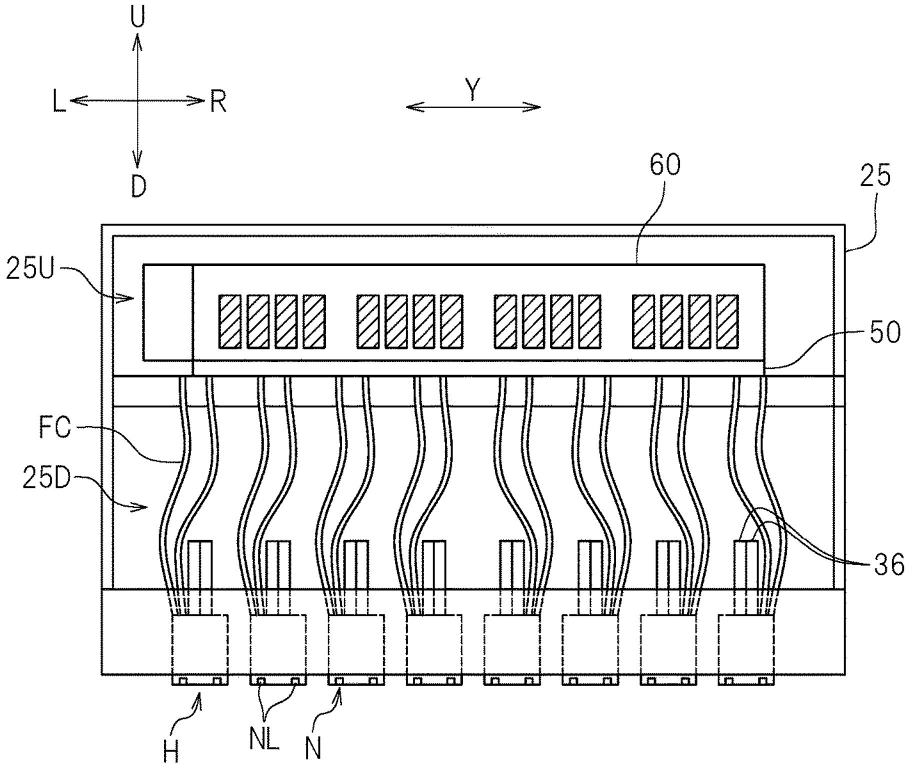
FIG. 2 is a view illustrating the configuration of the interior of a carriage.

FIG. 1 is a front view of a large-format inkjet printer (hereinafter simply "printer") 10 according to a preferred embodiment of the present invention. The printer 10 causes a rolled recording medium 5 to be consecutively transferred frontward and causes ink to be ejected from eight ink heads H (all of which are shown in FIG. 2), which are mounted on a carriage 25 that moves along the main scanning direction Y, to print images on the recording medium 5.

The recording medium 5 is an object on which images are to be printed. The recording medium 5 is not limited to a particular material. The recording medium 5 may be, for example, paper materials such as plain paper and printing paper for inkjet printers, transparent sheets made of glass or resin, or sheets made of metal or rubber. It is also possible that the recording medium 5 may be made of fabric.

As illustrated in FIG. 1, the printer 10 includes a printer main body 10*a* and legs 11 that supports the printer main body 10*a*. The printer main body 10*a* extends along the main scanning direction Y. The printer main body 10*a* includes a guide rail 21 and a carriage 25 engaged with the guide rail 21. The guide rail 21 extends along the main scanning direction Y. The guide rail 21 guides movement of the carriage 25 along the main scanning direction Y. An endless belt 22 is secured to the carriage 25. The belt 22 is wrapped around a pulley 23*a*, which is disposed near the right end of the guide rail 21, and a pulley 23*b*, which is disposed near the left end of the guide rail 21. A carriage motor 24 is fitted to the right-side pulley 23*a*. The carriage motor 24 is electrically connected to a controller 100. The carriage motor 24 is controlled by the controller 100. Driven by the carriage motor 24, the pulley 23*a* rotates, and the belt 22 runs accordingly. This causes the carriage 25 to move in a main scanning direction Y along the guide rail 21. Thus, as the carriage 25 moves in a main scanning direction Y, the ink heads H accordingly move in the main scanning direction Y. In the present preferred embodiment, the belt 22, the pulley 23*a*, the pulley 23*b*, and the carriage motor 24 define a carriage moving mechanism 20 that moves the carriage 25 and the ink heads H, mounted on the carriage 25, along the main scanning direction Y.

A platen 12 is disposed below the carriage 25. The platen 12 extends along the main scanning direction Y. The recording medium 5 is to be placed on the platen 12. Pinch rollers that press the recording medium 5 downward from above are provided above the platen 12. The pinch rollers 31 are disposed rearward relative to the carriage 25. The platen 12 is provided with grit rollers 32. The grit rollers 32 are disposed below the pinch rollers 31. The grit rollers 32 are provided at positions that face the pinch rollers 31. The grit rollers 32 are connected to a feed motor 33. The grit rollers 32 are rotatable by receiving the driving force from the feed motor 33. The feed motor 33 is electrically connected to the controller 100. The feed motor 33 is controlled by the controller 100. As the grit rollers 32 rotate with the recording medium 5 being pinched between the pinch rollers 31 and the grit rollers 32, the recording medium 5 is delivered in a sub-scanning direction X. In the present preferred embodiment, the pinch rollers 31, the grit rollers 32, and the feed motor 33 define a transfer mechanism 30 that transfers the recording medium 5 along the sub-scanning direction X. The transfer mechanism 30 and the carriage moving mechanism 20 together define a carriage mechanism that relatively moves the recording medium 5 and the carriage 25.

As illustrated in FIG. 1, the printer 10 includes a heater 35. The heater 35 is disposed below the platen 12. The heater 35 is disposed frontward relative to the grit rollers 32. The heater 35 heats the platen 12. When the platen 12 is heated, the recording medium 5 placed on the platen 12 and the ink landed on the recording medium 5 are heated, and drying of the ink is facilitated. The heater 35 is electrically connected to the controller 100. The heating temperature of the heater 35 is controlled by the controller 100.

FIG. 2 is a front view illustrating the configuration of the interior of the carriage 25. FIG. 2 shows the interior of the carriage 25 viewed from the front. Although a cover may be provided in front of the carriage 25, the cover is removed in FIG. 2. As illustrated in FIG. 2, the interior of the carriage 25 preferably has a two-compartment structure, including an upper compartment 25U and a lower compartment 25D. The lower compartment 25D incorporates eight ink heads H, for example. The upper compartment 25U incorporates a substrate 50. The substrate 50 includes drive signal generator circuits 51 (see FIGS. 4 and 5). The substrate 50 is also provided with a cooling device 60 mounted thereon.

The eight ink heads H are arrayed along the main scanning direction Y in the carriage 25. Each of the eight ink heads H includes two nozzle arrays NL. Each of the nozzle arrays NL includes a plurality of nozzles N arrayed along the sub-scanning direction X. The number of nozzles N per one nozzle array NL may be, for example, 300. Of course, this is merely an example, and the number of nozzles N per one nozzle array LN is not limited to any particular number.

As illustrated in FIG. 2, each of the ink heads H is connected to dampers 36. One damper 36 is provided per one nozzle array NL. That is, each one of the ink heads H is provided with two dampers 36 connected thereto. The damper 36 is a member that adjusts the pressure of the ink inside the nozzle N when stationary. Each of the 16 dampers 36 is allowed to communicate with a respective one of ink cartridges (not shown) by ink supply passages (not shown). The ink cartridges may be provided detachably, for example, in a right end portion of the printer main body 10*a*. One ink cartridge is provided correspondingly to each one of the nozzle arrays NL. Each of the ink cartridges stores an ink, such as a special color ink or a process color ink, such as one of CMYK colors. The nozzles N of one of the nozzle arrays NL eject the ink that is stored in the ink cartridge connected to the corresponding nozzle array NL. It is possible that different inks may be ejected from different nozzle arrays of the 16 nozzle arrays, or that some of the nozzle arrays may eject the same ink. The types of inks ejected from the nozzle arrays NL are not limited. In addition, the materials of the inks are not limited in any way, and various types of materials that have conventionally been used as the ink materials for inkjet printers may be used. The inks may be solvent-based pigment inks or aqueous pigment inks. The inks may also be aqueous dye inks, ultraviolet curing pigment inks that cure when irradiated with ultraviolet rays, or the like.

Figure 3:
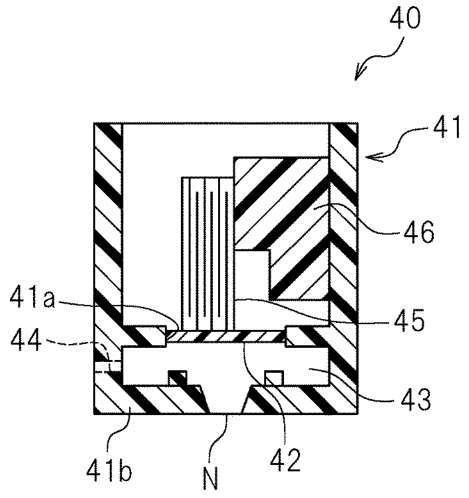
FIG. 3 is a partial cross-sectional view illustrating a region surrounding one of the nozzles.

Each of the eight ink heads H includes actuators provided therein, and each of the actuators includes a piezoelectric element. FIG. 3 is a partial cross-sectional view illustrating a region surrounding one of the nozzles N. The actuator 40 is provided for each of the nozzles N. Each of the actuators 40 is controlled by the controller 100 (see FIG. 1) and the drive signal generator circuit 51 provided on the substrate 50. Each of the actuators 40 is actuated to cause the nozzles N to eject ink.

The actuators 40 belonging to one of the nozzle arrays NL are electrically connected to a respective one of the drive signal generator circuits 51 provided on the substrate 50. The same number (16 herein) of drive signal generator circuits 51 as the number of nozzle arrays NL are provided on the substrate 50. The actuators 40 are connected to the drive signal generator circuits 51 via flexible cables FC (see FIG. 2). The actuators 40 are supplied with signals via the flexible cables FC. The actuators 40 of one of the nozzle arrays NL may be actuated upon receiving a drive signal generated by a respective one of the drive signal generator circuits 51. However, whether each one of the actuators 40 is allowed to be connected or not connected to the drive signal generator circuit 51 is controlled by the controller 100. In other words, the controller 100 controls the ink ejection timing from each of the nozzles N, and each of the drive signal generator circuits 51 controls the drive signal to control ink ejection conditions (such as ink droplet size, for example) for each of the nozzle arrays NL.

As illustrated in FIG. 3, each of the actuators 40 includes a hollow case 41 including an aperture 41*a*, and a diaphragm 42 fitted to the case 41 so as to close the aperture 41*a*. Together with the case 41, the diaphragm 42 defines a pressure chamber 43 that stores ink. The diaphragm 42 partitions a portion of the pressure chamber 43. The diaphragm 42 is elastically deformable inward and outward of the pressure chamber 43. The diaphragm 42 is deformable so as to increase and decrease the volumetric capacity of the pressure chamber 43. The diaphragm 42 is typically made of a resin film.

An ink inflow port 44 through which ink flows is provided in a side wall of the case 41. The ink inflow port 44 should be connected to the pressure chamber 43, but the position of the ink inflow port 44 is not limited to any particular position. Ink is supplied from the damper 36 through the ink inflow port 44 into the pressure chamber 43, in which the ink is stored. The nozzle N is provided in a lower surface 41*b* of the case 41. The nozzle N is in communication with the pressure chamber 43.

A piezoelectric element 45 abuts on a surface of the diaphragm 42 that is opposite to the pressure chamber 43. A portion of the piezoelectric element 45 is secured to a securing member 46. In the present preferred embodiment, the piezoelectric element 45 is a laminated structure in which piezoelectric material layers and electrically conductive layers are stacked alternately. The piezoelectric element 45 expands or contracts when receiving a signal from a drive signal generator circuit 51 to cause the diaphragm 42 to elastically deform outward or inward of the pressure chamber 43. Herein, a longitudinal vibration mode piezoelectric transducer (PZT) is used, for example. The longitudinal vibration mode PZT is able to expand and contract in the stacking direction and is able to contract when discharged and expand when charged, for example. However, the type of the piezoelectric element 45 is not limited to any particular type.

In the ink head H with such a configuration, when lowering the potential of the piezoelectric element 45 from a reference potential, for example, the piezoelectric element 45 is caused to contract. Accordingly, the diaphragm 42 elastically deforms outward of the pressure chamber 43 from its initial position, causing the pressure chamber 43 to expand. Note that the phrase "the pressure chamber 43 expands" means that the volumetric capacity of the pressure chamber 43 increases because of deformation of the diaphragm 42. Next, by raising the potential of the piezoelectric element 45, the piezoelectric element 45 expands in a stacking direction. This causes the diaphragm 42 to elastically deform inward of the pressure chamber 43, causing the pressure chamber 43 to contract. Note that the phrase "the pressure chamber 43 contracts" means that the volumetric capacity of the pressure chamber 43 decreases because of deformation of the diaphragm 42. Such expansion and contraction of the pressure chamber 43 change the pressure in the pressure chamber 43. This pressure change in the pressure chamber 43 compresses the ink inside the pressure chamber 43 to form an ink droplet, which is ejected from the nozzle N. Thereafter, the potential of the piezoelectric element 45 is returned to the reference potential, so that the diaphragm 42 returns to the initial position, causing the pressure chamber 43 to expand. At this time, ink flows through the ink inflow port 44 into the pressure chamber 43. The piezoelectric element 45 operates in the above-described manner based on a drive signal transmitted from the drive signal generator circuit 51.

Figure 4:
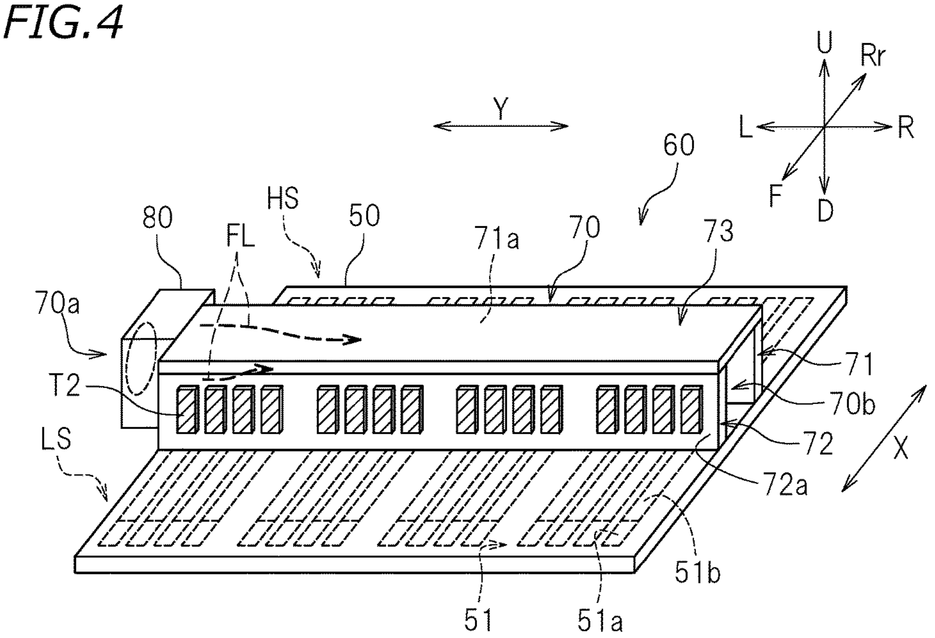
FIG. 4 is a perspective view illustrating a substrate viewed from the front.
Figure 5:
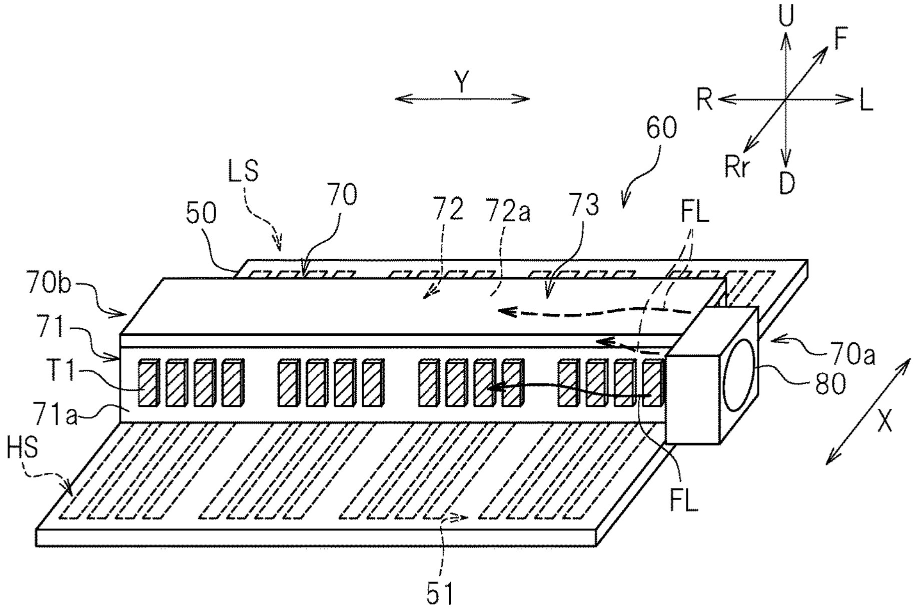
FIG. 5 is a perspective view illustrating the substrate viewed from the rear.
Figure 6:
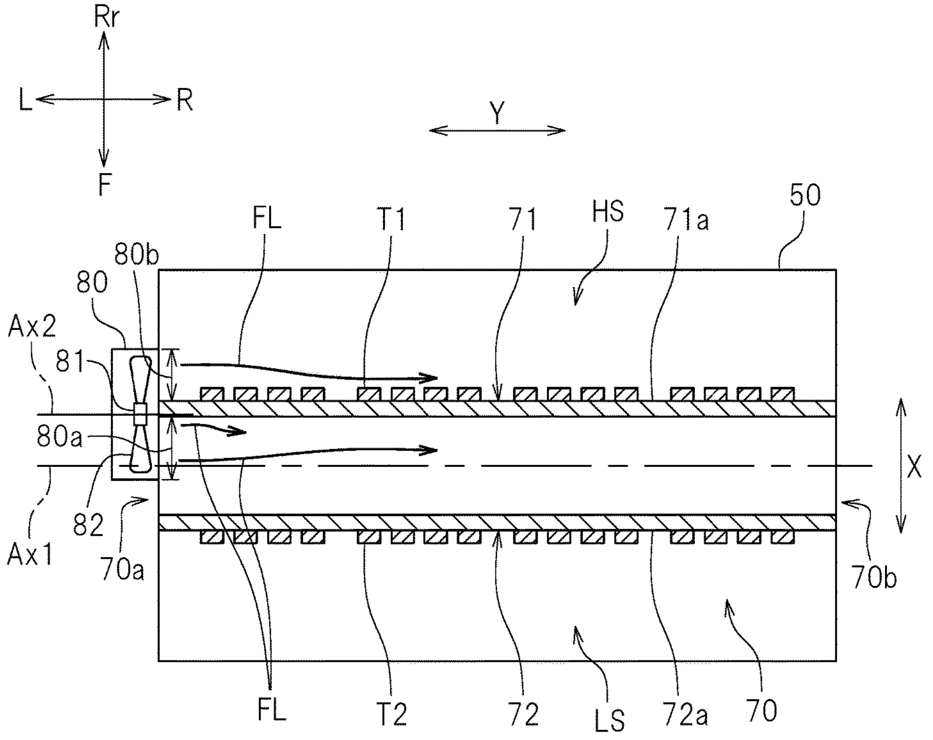
FIG. 6 is a schematic view illustrating the substrate viewed from the top.

The substrate 50 is provided in the upper compartment 25U and is connected to the controller 100 and the actuators 40. FIG. 4 is a perspective view of the substrate 50 viewed from the front. FIG. 5 is a perspective view of the substrate 50 viewed from the rear. FIG. 6 is a schematic view showing the substrate 50 viewed from the top. The substrate 50 may be, for example, a glass epoxy substrate, on a surface of which circuits are constructed and various electronic components are mounted. The substrate 50 includes 16 drive signal generator circuits 51 provided thereon. Each of the drive signal generator circuits 51 includes a drive waveform generator circuit 51*a* and a drive waveform amplifier circuit 51*b*. The drive waveform generator circuit 51*a* is a circuit that receives an instruction from the controller 100 and generates a drive waveform for actuators 40. The drive waveform is a waveform in which a plurality of drive pulses are combined. A plurality of types of drive waveforms are preset. The controller 100 instructs the drive waveform generator circuit 51*a* to generate which type of waveform to be generated. According to the type of the waveform, the size of the ink droplet ejected from the nozzle N, for example, is determined.

Figure 7:
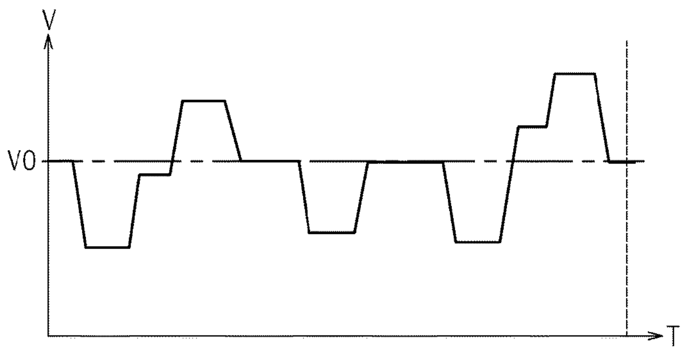
FIG. 7 is a graph illustrating an example of drive waveform for an actuator.

FIG. 7 is a graph illustrating an example of a drive waveform for an actuator 40. The drive waveform shown in FIG. 7 is a drive waveform that is used to form one ink dot. In FIG. 7, the vertical axis V represents electric potential, and the horizontal axis T represents time. On the vertical axis V in FIG. 7, V0 represents the reference potential of the piezoelectric element 45. At V0, the piezoelectric element 45 does not operate, so ink is not ejected or replenished. When the potential of the piezoelectric element 45 rises to a potential higher than V0, the piezoelectric element 45 expands, causing ink to be ejected. When the potential of the piezoelectric element 45 lowers to a potential lower than V0, the piezoelectric element 45 contracts, causing ink to be replenished. As shown in FIG. 7, in the process of forming one ink dot, the potential rises and falls several times across V0. Accordingly, the actuator 40 ejects ink a plurality of times. There are also some variations in the potential at that time (which determines the amount of ink that is ejected at one time). The drive waveform is adjusted appropriately depending on various factors such as the characteristics of the ink head, the type of the ink, and the desired print quality. In inkjet printers, the drive waveform for actuators is generally as described above.

Figure 8:
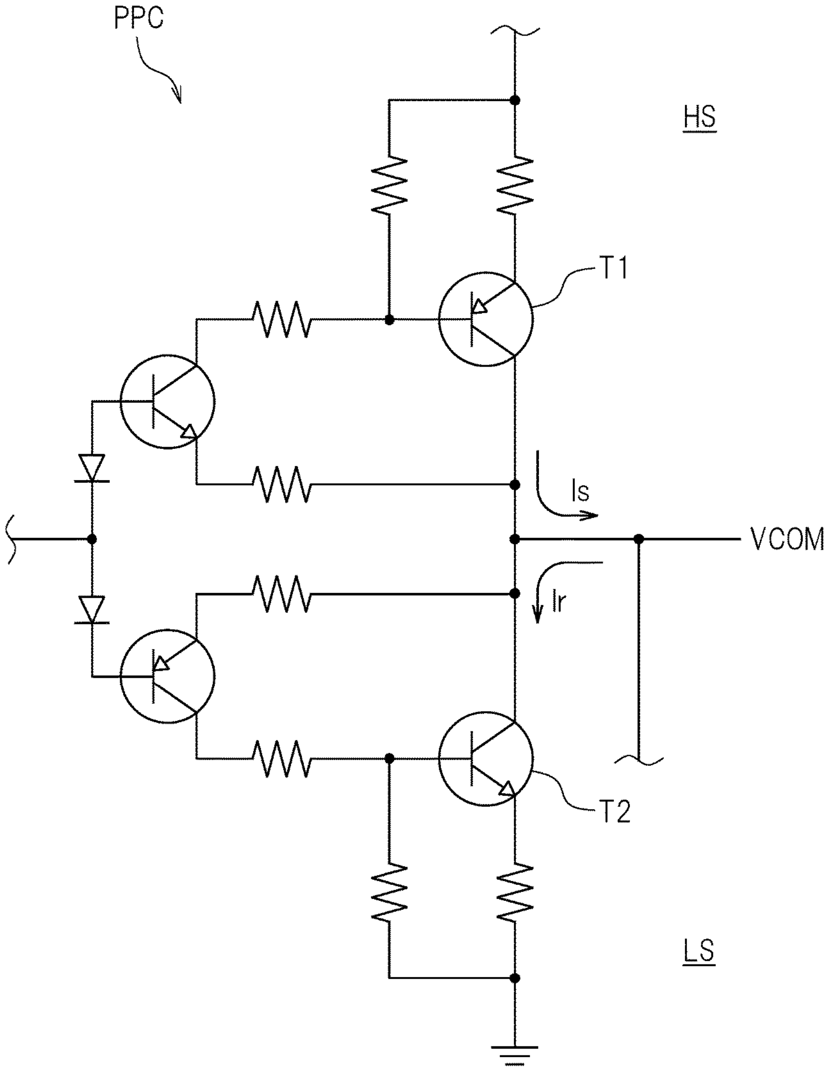
FIG. 8 is a circuit diagram illustrating a primary portion of a push-pull circuit.

The drive waveform amplifier circuit 51*b* amplifies the drive waveform that has been generated in a waveform shown in FIG. 7 by the drive waveform generator circuit 51*a* to be a drive signal that actually drives the actuator 40. The drive waveform amplifier circuit 51*b* includes a push-pull circuit so that it amplifies a drive waveform via the push-pull circuit. The drive waveform amplifier circuit 51*b* amplifies the drive waveform generated by the drive waveform generator circuit 51*a* in such a manner that the drive waveform is not distorted and is almost kept in its original form. FIG. 8 is a circuit diagram illustrating a primary portion of the push-pull circuit. As illustrated in FIG. 8, the push-pull circuit PPC includes a first transistor T1 and a second transistor T2. The first transistor T1 is an example of a "first electronic component". The second transistor T2 is an example of a "second electronic component". On the substrate 50, the first transistors T1 and the second transistors T2 are disposed so as to be in contact with the cooling device 60, as illustrated in FIGS. 4 to 6. The first transistors T1 and the second transistors T2 are electronic components that mainly generate heat on the substrate 50.

As illustrated in FIG. 8, the first transistor T1 is disposed on a push side HS in the push-pull circuit PPC. The push side HS is a circuit from which a drive signal Is is fed to the piezoelectric element 45. For this reason, the push side in the push-pull circuit PPC is also referred to as a high side HS, as appropriate. The second transistor T2 is disposed on a pull side LS of the push-pull circuit PPC. The pull side LS is a circuit to which current Ir is fed back from the piezoelectric element 45. The pull side is also referred to as a low side LS, as appropriate. Because the first transistor T1 and the second transistor T2 operate in electrically opposite directions, transistors of opposite polarity are used for the first transistor T1 and the second transistor T2. Herein, a PNP transistor is used for the first transistor T1, and an NPN transistor is used for the second transistor T2.

In the push-pull circuit PPC, power loss is caused in each of the high side HS and the low side LS, and the power loss is transformed into heat. On the high side HS, the electronic component that mainly causes electric power loss and generates heat is the first transistor T1. On the low side LS, the electronic component that mainly causes electric power loss and generates heat is the second transistor T2.

As illustrated in FIGS. 4 to 6, the cooling device 60 is mounted at or substantially at the center of the substrate 50. The cooling device 60 is a member that cools electronic components, mainly the first transistor T1 and the second transistor T2. The cooling device 60 includes a heat sink 70 and a cooling fan 80. The heat sink 70 preferably has a substantially rectangular parallelepiped tubular shape, the opposite ends of which are open. The heat sink 70 is arranged so that a first end 70*a* and a second end 70*b* face in the main scanning direction Y. The heat sink 70 includes a first wall member 71, a second wall member 72, and a top panel 73. The first wall member 71 is a rectangular plate-shaped member that is erected vertically on the substrate 50. The first wall member 71 is arranged so that its longitudinal axis is along the main scanning direction Y and its shorter axis is along the upward/downward direction. The second wall member 72 is located frontward relative to the first wall member 71 and parallel to the first wall member 71. The second wall member 72 is completely or substantially in the same shape as the first wall member 71. The top panel 73 bridges between the first wall member 71 and the second wall member 72. As illustrated in FIGS. 4 and 5, the top panel 73 bridges between the top surface of the first wall member 71 and the top surface of the second wall member 72. The first wall member 71 and the top panel 73 are secured together by screws or the like, and so are the second wall member 72 and the top panel 73. The first wall member 71, the second wall member 72, and the top panel 73 together define the heat sink 70 with an angular C-shaped cross section, and the heat sink 70 is attached to the substrate 50, to define a flow passage in a rectangular parallelepiped tubular shape, for example. The first wall member 71, the second wall member 72, and the top panel 73 may be made of, for example, a metal with good heat conduction, such as an aluminum alloy. However, the material for the first wall member 71, the second wall member 72, and the top panel 73 are not limited thereto. In particular, because the top panel 73 defines a shape of a flow passage, the top panel 73 need not be made of a material with good heat conduction. In addition, the heat sink 70 does not need to be defined by separate members, and it is also possible that the heat sink 70 may have an integral structure.

On one end of the heat sink 70, the cooling fan 80 is fitted. In the present preferred embodiment, the cooling fan 80 is fitted onto the first end 70*a*, which is the left end of the heat sink 70. The second end 70*b*, which is the opposite end to the first end 70*a*, is merely open, and is not provided with a cooling fan.

As illustrated in FIG. 6, the cooling fan 80 is disposed so that its axial center Ax2 is offset in an X direction from the axial center Ax1 of the heat sink 70. More specifically, the cooling fan 80 is disposed so as to be offset toward the first wall member 71 (i.e., rearward), and a portion of the cooling fan 80 that is adjacent to the first wall member 71 protrudes rearward from an outer wall surface 71*a* of the first wall member 71. Hereinafter, the protruding portion of the cooling fan 80 that is in its air blowing side may be referred to as an outer air blowing portion 80*b*. On the other hand, the portion of the cooling fan 80 that is other than the outer air blowing portion 80*b* in its air blowing side faces against the first end 70*a* of the heat sink 70. This portion of the cooling fan 80 that faces the first end 70*a* may hereinafter be referred to as an inner air blowing portion 80*a*. Meanwhile, a portion of the first end 70*a* that is adjacent to the second wall member 72 does not face the cooling fan 80, and this portion is merely open. The cooling fan 80 is designed to blow air flow FL into the heat sink 70 in that condition. However, it is not necessary that the cooling fan 80 blow the air flow into the heat sink 70, but it is possible that the cooling fan 80 may generate the air flow by sucking air from the interior of the heat sink 70.

Sixteen first transistors T1 are in contact with the outer wall surface 71*a* of the first wall member 71 of the heat sink 70. The 16 first transistors T1 are fitted on the outer wall surface 71*a* in the same lines as the respective actuators 40 that transmit drive signals. The circuits on the high side HS of the drive waveform amplifier circuits 51*b* are mainly located in an area of the substrate 50 that is rearward relative to the heat sink 70 (i.e., in an area of the substrate 50 that is adjacent to the first wall member 71). On the other hand, 16 second transistors T2 are in contact with the outer wall surface 72*a* of the second wall member 72 of the heat sink 70. The 16 second transistors T2 are fitted on the outer wall surface 72*a* so as to be disposed opposite to the corresponding first transistors T1. The circuits on the low side LS of the drive waveform amplifier circuits 51*b* are mainly located in an area of the substrate 50 that is frontward relative to the heat sink 70 (i.e., in an area of the substrate 50 that is adjacent to the second wall member 72.

As illustrated in FIG. 1, an operation panel 110 is provided on a right end portion of the printer main body 10*a*. The operation panel 110 is provided with a display screen to display operating status, input keys to be operated by the user, and so forth. The controller 100 that controls various operations of the printer 10 is accommodated inside the operation panel 110. The controller 100 is communicatively connected to the feed motor 33, the carriage motor 24, the heater 35, the actuators 40, and the drive signal generator circuits 51, and the controller 100 is able to control these components.

The configuration of the controller 100 is not limited to a particular configuration. The controller 100 may be a microcomputer, for example. The hardware configuration of the microcomputer is not limited in any way. For example, the microcomputer may include an interface (I/F) that receives print data or the like from external apparatuses such as a host computer, a central processing unit (CPU) that executes control program instructions, a read only memory (ROM) that stores program(s) executed by the CPU, a random access memory (RAM) used as a working area to deploy the program(s), and a storage, such as a memory, that stores the program(s) and various data. The controller 100 need not be provided inside the printer main body 10*a*. For example, the controller 100 may be a computer that is provided external to the printer main body 10*a* and communicatively connected to the printer main body 10*a* via a wired or wireless communication.

The controller 100 controls the carriage moving mechanism 20 to cause the carriage 25 to scan along the main scanning direction Y, and also controls the actuators 40 to cause ink to be ejected from the nozzles N, so as to print on the recording medium 5. The controller 100 controls the operations of the carriage motor 24 and also controls ink ejection timing of each of the actuators 40. When printing for one scanning line is completed, the controller 100 causes the feed motor 33 to operate so as to feed the recording medium 5 frontward. Printing for one region on the recording medium 5 is completed by one or a plurality of times of scanning with the carriage 25.

As has been discussed earlier, because of diversification of inks, higher printing density, and demands for high speed, large-sized printers, such as the printer 10 according to the present preferred embodiment, tend to have an increased number of nozzles in the carriage and a higher nozzle density. Consequently, the cooling device that cools electronic components typified by transistors is also required to have higher cooling capability. However, in order to enhance the cooling capability of the cooling device, it has been necessary with conventional techniques to enhance fins and/or cooling fans, which results in higher costs.

In view of the problem, the printer 10 according to the present preferred embodiment includes the cooling device 60 provided with the tubular-shaped heat sink 70 and the cooling fan 80 a portion of which protrudes rearward relative to the heat sink 70. The first transistors T1 are disposed so as to be in contact with the first wall member 71, which is the rear side surface of the heat sink 70, while the second transistors T2 are disposed so as to be in contact with the second wall member 72, which is the front side surface of the heat sink 70.

The configuration of the cooling device 60 is achieved based on the knowledge obtained by the present inventors. The present inventors measured the voltages and currents in the circuits on the high side HS and the low side LS of the drive waveform amplifier circuits 51*b*, and calculated the electric power loss in the high side HS and the low side LS based on the measured voltages and currents. As a result, the present inventors discovered that the power loss in the high side HS is greater than the power loss in the low side LS. This difference in power loss was far greater than the difference that results from the fact that the first transistors T1 are PNP transistors and the second transistors T2 are NPN transistors (as a device element, the PNP transistor shows a slightly greater power loss than the NPN transistor), and it is believed that the result was mainly due to the characteristics of the drive waveform. In other words, it has been discovered that, in the drive waveform amplifier circuit 51*b* of the inkjet printer, the first transistor T1 generates a larger amount of heat than the second transistor T2. This phenomenon is peculiar to drive waveform amplifier circuits for inkjet printers. This knowledge has been discovered by the present inventors.

Based on the above-described knowledge, in the printer according to the present preferred embodiment, the first transistors T1 are provided on the first wall member 71 side of the heat sink 70, while the second transistors T2 are provided on the second wall member 72 side of the heat sink 70. In addition, the outer air blowing portion 80*b* of the cooling fan 80 is caused to protrude outward relative to the first wall member 71 so that the air flow FL is able to be sent to the first transistors T1 from the outside of the heat sink 70. The outer air blowing portion 80*b* of the cooling fan 80 allows the air flow FL along the outer wall surface 71*a* of the first wall member 71. As a result, the first transistors T1 are cooled from both the outside and the inside of the heat sink 70, so the first transistors T1 are cooled more efficiently. On the other hand, the second transistors T2, which generate relatively lower heat, are cooled only from the inside of the heat sink 70 by the air flow FL that is sent by the inner air blowing portion 80*a* into the flow passage in the heat sink 70. In the cooling device 60 according to the present preferred embodiment, electronic components that generate a larger amount of heat (the first transistors T1 herein) are gathered in a region where the cooling capability is higher (the first wall member 71 side herein) so as to cool them intensively, such that the cooling efficiency as a whole is increased. In other words, the configuration of the cooling device 60 shown in the present preferred embodiment is particularly effective for amplifier circuits in which the amount of heat generated is considerably different between the high side and the low side, such as the drive waveform amplifier circuits for inkjet printers.

In the printer 10 according to the present preferred embodiment, the cooling device 60 is mounted on the substrate 50. Because the cooling device 60 is mounted on the substrate 50, the wires that connect the first transistors T1 and the second transistors T2 with the substrate 50 need not be arranged outside the substrate 50, which serves to reduce the wires and achieve space savings. Moreover, the air flow from the outer air blowing portion 80*b* of the cooling device 60 is also able to cool components on the substrate 50 other than the first transistors T1 and the second transistors T2.

In addition, the configuration in which the axial center Ax2 of the cooling fan 80 is offset from the axial center Ax1 of the heat sink 70 in a direction X toward the first wall member 71 also improves cooling efficiency for other reasons than the reasons stated above. The cooling fan 80 includes a rotary shaft 81, which is rotatable about the axial center Ax2, and blades 82, which extend radially outward from the rotary shaft 81, so as to generate air flow by rotating the rotary shaft 81 and the blades 82. Accordingly, the air flow is weaker in a region near the axial center Ax2 than in the peripheral region. One of the reasons is that the air flow is generated by the blades 82 (the rotary shaft 81 does not generate air flow). Another reason is that, because the peripheral region has a greater radius than the central region, the rotational speed of the blades 82 is higher in the peripheral region than in the central region. In FIG. 6, the length of each of the arrows that indicates the air flow FL represents the strength of the air flow. In the cooling device 60 according to the present preferred embodiment, the axial center Ax2 of the cooling fan 80 is offset from the axial center Ax1 of the heat sink 70. As a result, the peripheral portion of the cooling fan 80, which produces a greater volume of air flow, is used effectively.

In the printer 10 according to the present preferred embodiment, the substrate 50, on which the drive signal generator circuits 51 are provided, is mounted on the carriage 25. One of the reasons is to reduce the length of the wires between the drive signal generator circuits 51 and the actuators 40. Another reason is that movements of the carriage 25 during printing also cause air flow to hit the substrate 50, which also has a cooling effect on the substrate 50. For that reason, the heat sink 70 is arranged so that the first end 70*a* and the second end 70*b* face in the main scanning directions Y, and the flow passage of the heat sink 70 extends along the main scanning direction Y. During printing, the carriage 25 moves along the main scanning direction Y, and the movement of the carriage 25 causes air flow to pass through the interior and along the outer wall surface of the heat sink 70. That air flow also enables the heat sink 70 to cool the first transistors T1 and the second transistors T2.

The substrate 50 is also designed so that the amount of the heat generated in the area rearward of the heat sink 70 is greater than the amount of the heat generated in the area frontward of the heat sink 70. More specifically, the circuits on the high side HS of the push-pull circuit PPC are disposed in the rearward of the heat sink 70, while the circuits on the low side LS of the push-pull circuit PPC are disposed in the frontward of the heat sink 70. The circuits on the high side HS of the push-pull circuit PPC generate higher heat than the circuits on the low side LS thereof. The circuits on the high side HS, which generate a relatively greater amount of heat, are cooled by the air flow FL flowing outside of the first wall member 71. By designing the circuits in this way, the electronic components that generate a greater amount of heat are selectively gathered in an area of the substrate 50 that has higher cooling capability (the rear area herein), so that the cooling efficiency of the substrate 50 as a whole is increased.

It should be noted that the substrate 50 is arranged so that its low side LS, which generates relatively a less amount of heat, faces frontward. As illustrated in FIG. 2, the eight ink heads H are arrayed to the front side of the substrate 50. This means that the side of the substrate 50 that generates high heat is located away from the ink heads H. Such an arrangement of the substrate 50 relative to the ink heads H reduces the heat effects on the ink heads H coming from the electronic components.

Preferred Embodiment with Second Heat Sink

Figure 9:
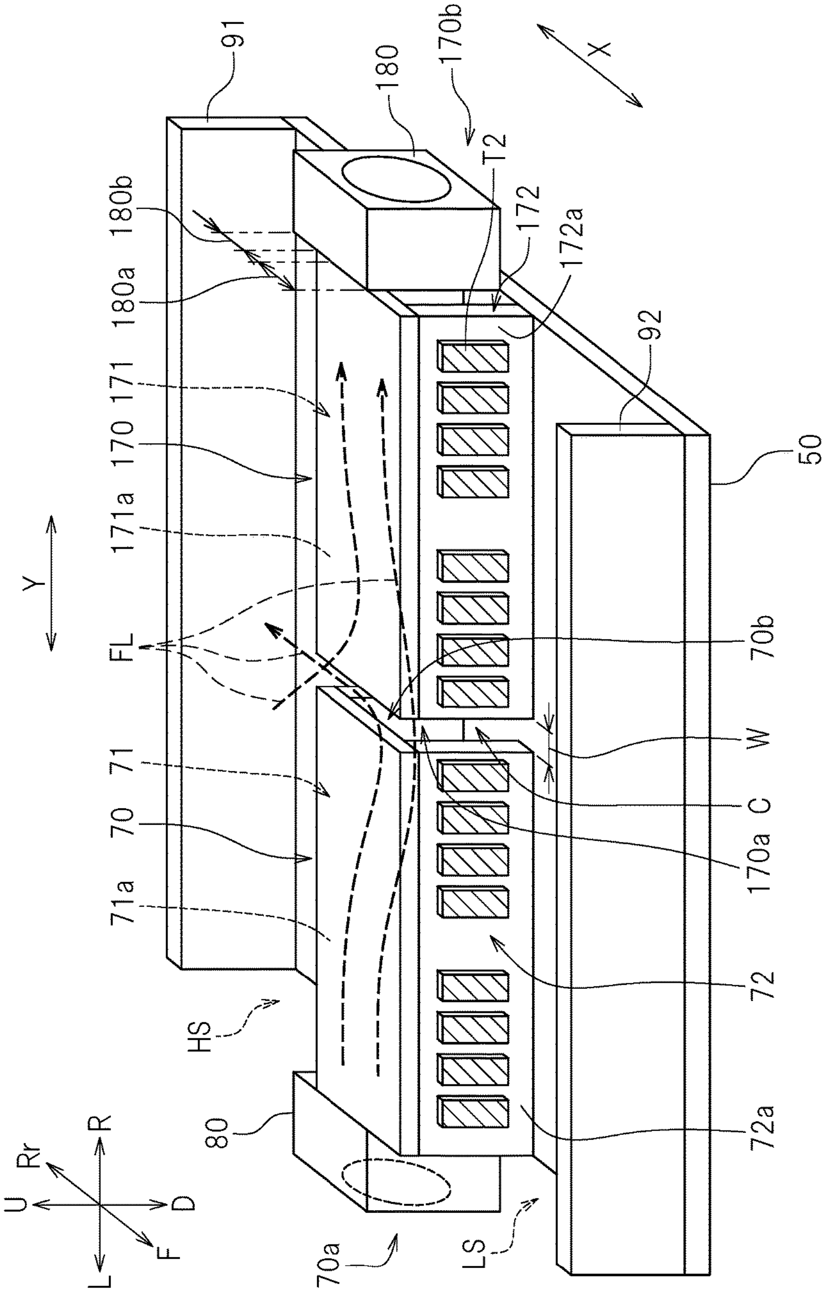
FIG. 9 is a perspective view illustrating a substrate provided with two heat sinks.

Some additional components may further be added to the printer 10 according to the foregoing preferred embodiment. FIG. 9 is a perspective view illustrating a substrate 50 provided with two heat sinks. Referring to FIG. 9, a heat sink 70 has a slightly less than half the length of the substrate 50 along the main scanning direction Y, and the heat sink 70 is provided on a left area of the substrate 50, not the central area. A second heat sink 170 is located to the right of the heat sink 70. For this reason, the heat sink 70 may be referred to as a “first heat sink 70”. Like the first heat sink 70, the second heat sink 170 is also has a substantially rectangular parallelepiped tubular shape. The both ends of the second heat sink 170 are open. The second heat sink 170 is a member that has the same shape, or substantially the same shape, as the first heat sink 70. The second heat sink 170 is also constructed by, for example, combining aluminum alloy plates. The second heat sink 170 may be completely the same member as the first heat sink 70.

The second heat sink 170 is disposed to the right of the first heat sink 70 so as to extend along the main scanning direction Y. A first end 170*a*, which is the left side end of the second heat sink 170, faces a second end 70*b* of the first heat sink 70. The first heat sink 70 and the second heat sink 170 are disposed in the same line so as to extend along the main scanning direction Y. However, the second end 70*b* of the first heat sink 70 and the first end 170*a* of the second heat sink 170 are not in contact with each other, and a gap C having a width W exists therebetween. As with the first heat sink 70, a rear wall of the second heat sink 170 is referred to as a first wall member 171 of the second heat sink 170, and a front wall of the second heat sink 170 is referred to as a second wall member 172 of the second heat sink 170.

A second cooling fan 180 is fitted on a right end (second end 170*b*) of the second heat sink 170. The second cooling fan 180 is provided so that a portion thereof (inner air blowing portion 180*a*) faces the second end 170*b* of the second heat sink 170. Another portion (outer air blowing portion 180*b*) of the second cooling fan 180 protrudes rearward from the second heat sink 170. Thus, the set of the second heat sink 170 and the second cooling fan 180 is plane-symmetrical with the set of the first heat sink 70 and the cooling fan 80 (hereinafter also referred to as a “first cooling fan 80” when appropriate) with respect to a plane extending along the sub-scanning direction X.

The second cooling fan 180 is designed to cause the air flow FL to flow in the same direction as the direction in which the first cooling fan 80 blows the air flow. Herein, the first cooling fan 80 sends out the air flow FL rightward, so the second cooling fan 180 sucks the air flow FL rightward.

Eight second transistors T2 are arrayed and fitted on an outer wall surface 72*a* of a second wall member 72 of the first heat sink 70. Of the 16 second transistors T2, the remaining eight second transistors T2 are fitted so as to be in contact with an outer wall surface 172*a* of the second wall member 172 of the second heat sink 170. In addition, although not shown in the drawings, eight first transistors T1 are arrayed and fitted on an outer wall surface 71*a* of a first wall member 71 of the first heat sink 70. Of the 16 first transistors T1, the remaining eight first transistors T1 are fitted so as to be in contact with an outer wall surface 171*a* of the first wall member 171 of the second heat sink 170. Each of the first heat sink 70 and the second heat sink 170 cools the corresponding eight transistors among the 16 first transistors T1 and the corresponding eight transistors among the 16 second transistors T2.

The gap C between the first heat sink 70 and the second heat sink 170 allows a portion of the air flow that passes through the interior of the first heat sink 70 to flow out and allows fresh air to be taken into the second heat sink 170. In the flow passage of the first heat sink 70, the air flow FL flows rightward, and while it flows, it draws heat from the first transistors T1 and the second transistors T2, so the temperature thereof increases. The gap C allows a portion of the air flow FL the temperature of which has increased to flow out of the heat sink. In addition, from the gap C, fresh air flows into the second heat sink 170. This is because the second cooling fan 180 sucks air in a rightward direction. Because of the presence of the gap C, the interior of the second heat sink 170 is supplied with relatively cool air flow FL.

The width W of the gap C may be determined appropriately, taking into consideration the air blowing capability of the first cooling fan 80, the dimensions of various parts of the first heat sink 70, and so forth. According to the knowledge of the present inventors, it is preferable that the width W be at least less than or equal to the equivalent diameter of the second end 70*b* of the first heat sink 70 (in the present preferred embodiment, which also may be the equivalent diameter of the first end 70*a*). It is more preferable that the width W be less than or equal to about ½ of the above-mentioned equivalent diameter. According to the knowledge of the present inventors, it is desirable that the width W of the gap C should not be too large in order to pass the air flow FL efficiently from the first end 70*a* of the first heat sink 70 to the second end 170*b* of the second heat sink 170. If the width W of the gap C is too large, the air flow FL that has been heated when passing through the flow passage of the first heat sink 70 diffuses excessively through the gap C over the substrate 50, degrading the cooling efficiency of the substrate 50. In other words, the efficiency in exhausting the heat that should be discharged from the second end 170*b* of the second heat sink 170 drops.

The number of the heat sinks is not limited to two, but may be three or more. Each of the opposite ends of the heat sinks is not necessarily provided with a cooling fan. It is possible that a cooling fan may be fitted on the left end of each of the heat sinks, on the right end of each of the heat sinks, or on both ends thereof. Moreover, it is also possible that some of the heat sinks may not be provided with a cooling fan.

In addition to a plurality of heat sinks, the printer 10 may also include various other components. FIG. 9 shows that the substrate 50 is provided with partition plates 91 and 92 respectively at the rear of and in front of the heat sinks 70 and 170. As illustrated in FIG. 9, the first partition plate 91 is attached at the rear of the first wall members 71 and 171 so as to be arranged parallel to the first wall members 71 and 171. The first partition plate 91 is a plate-shaped member erected vertically on the substrate 50, and, for example, it has a height that is equal or substantially equal to the height of the first wall members 71 and 171. The first partition plate 91 enables the air flow outside the first wall members 71 and 171 to flow more efficiently. The first partition plate 91 prevents the air flow from escaping rearward relative to the substrate 50, thus increasing the cooling efficiency for the high side HS. The material for the first partition plate 91 may be, but is not limited to, plastic, for example.

In addition, the substrate 50 shown in FIG. 9 is also provided with a second partition plate 92. The second partition plate 92 is attached in front of the second wall members 72 and 172 so as to be arranged parallel to the second wall members 72 and 172. The second partition plate 92 is also a plate-shaped member erected vertically on the substrate 50, and, for example, it has a height that is equal or substantially equal to the height of the second wall members 72 and 172. The second partition plate enables the heat generated on the substrate 50 not to be transferred toward the ink heads H easily. It is preferable that the material for the second partition plate 92 be a material with poor heat conduction, such as plastic. The presence of the first partition plate 91 and the second partition plate 92 dissipates heat mainly in the main scanning directions Y and to prevent heat from dissipating in the sub-scanning directions X.

Hereinabove, preferred embodiments of the present invention have been described. It should be noted, however, that the foregoing preferred embodiments are merely exemplary and the present invention may be embodied in various other forms.

For example, in the foregoing preferred embodiments, the heat sink 70 has a rectangular parallelepiped tubular shape, but the shape of the heat sink 70 is not limited thereto. It is sufficient that the heat sink 70 should have a tubular shape and a flow passage provided therein, and should include the first wall member 71 and the second wall member 72, which are respectively in contact with the first transistors T1 and the second transistors T2. The cross-sectional shape of the heat sink 70 is not limited to any particular shape. Moreover, the first wall member 71 and the second wall member 72 do not need to face each other.

In addition, the cooling fan 80 protrudes outward only on the first wall member 71 side in the foregoing preferred embodiments. However, it is also possible that the cooling fan 80 may protrude in another direction. For example, it is possible to use a cooling fan 80 having a front-to-rear dimension greater than the front-to-rear dimension of the heat sink 70, and such a cooling fan 80 may protrude outward of the first wall member 71 and also protrude outward of the second wall member 72.

In the foregoing preferred embodiments, the substrate 50 is mounted on the carriage 25. However, the substrate 50 need not be mounted on the carriage 25. It is also possible that the substrate 50 may be disposed at another location in the printer 10. Furthermore, the cooling device 60 only need to be in contact with the first transistors T1 and the second transistors T2 to cool them, so the cooling device 60 need not be mounted on the substrate 50.

In the foregoing preferred embodiments, the carriage 25 moves along the main scanning direction Y and the recording medium moves along the sub-scanning direction X, but this is not necessarily required. The movements of the carriage 25 and the recording medium 5 are relative, so either one of them may move along the main scanning direction Y or along the sub-scanning direction X. For example, it is possible that the recording medium 5 may be placed immovably while the carriage 25 may be allowed to move both along the main scanning direction Y and the sub-scanning direction X. Alternatively, it is possible that both the carriage 25 and the recording medium 5 may be allowed to move both along the main scanning direction Y and the sub-scanning direction X.

The technologies disclosed herein may be applied to various types of inkjet printers. In addition to the so-called roll-to-roll inkjet printers as shown in the foregoing preferred embodiments, in which a rolled recording medium 5 is delivered, the technologies may also be applied to flat-bed inkjet printers, for example, in a similar manner. Moreover, the printer 10 is not limited to a printer that is to be used alone as an independent printer, but may be a printer that is combined with another apparatus. For example, the printer 10 may be incorporated in another apparatus.

Furthermore, the technologies disclosed herein are also applicable to any apparatus other than a printer equipped with an inkjet print head. For example, the technologies disclosed herein may also be applicable to a three-dimensional printer equipped with an inkjet print head. It should be noted that a portion of the elements included in the print heads according to preferred embodiments of the present invention may be disposed external to the print heads in terms of arrangement. For example, the drive signal generator circuits and the cooling device may not necessarily be mounted on the print head. While they should be electrically connected to the print head, they may be provided, for example, on the main body of the apparatus.

The terms and expressions used herein are for description only and are not to be interpreted in a limited sense. These terms and expressions should be recognized as not excluding any equivalents to the elements shown and described herein and as allowing any modification encompassed in the scope of the claims. The present invention may be embodied in many various forms. This disclosure should be regarded as providing preferred embodiments of the principles of the present invention. These preferred embodiments are provided with the understanding that they are not intended to limit the present invention to the preferred embodiments described in the specification and/or shown in the drawings. The present invention is not limited to the preferred embodiments described herein. The present invention encompasses any of preferred embodiments including equivalent elements, modifications, deletions, combinations, improvements and/or alterations which can be recognized by a person of ordinary skill in the art based on the disclosure. The elements of each claim should be interpreted broadly based on the terms used in the claim, and should not be limited to any of the preferred embodiments described in this specification or used during the prosecution of the present application.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An inkjet printer comprising:

one or a plurality of heads including actuators that cause an ink to be ejected;

one or a plurality of drive signal generators, including a first electronic component and a second electronic component, that generate a drive signal that drives the actuators; and a cooling device that cools at least the first electronic component and the second electronic component; wherein the first electronic component generates a greater amount of heat than the second electronic component when generating the drive signal;

the cooling device includes:

a first heat sink including wall members, a first end, and a second end, the wall members including a first wall member and a second wall member each including an outer wall, the first heat sink having a tubular shape defined by the wall members and being open at the first end and the second end; and a first cooling fan including an inner air blowing portion, disposed so as to face the first end of the first heat sink, and an outer air blowing portion, disposed outwardly relative to the inner air blowing portion, the first cooling fan directing air flow at least through an interior of the first heat sink and along the outer wall of the first wall member; wherein:

the first electronic component is in contact with the outer wall of the first wall member; and the second electronic component is in contact with the outer wall of the second wall member.

2. The inkjet printer according to claim 1, wherein:

the first cooling fan includes a rotary shaft and blades extending radially outward from the rotary shaft; and the rotary shaft is offset from an axial center of the first heat sink toward the first wall member.

3. The inkjet printer according to claim 1, wherein the drive signal generator includes:

a drive waveform generator that generates a waveform signal with a predetermined waveform; and a drive waveform amplifier that amplifies the waveform signal by a push-pull circuit to generate the drive signal;

the first electronic component is a first transistor provided on a push side of the push-pull circuit; and the second electronic component is a second transistor provided on a pull side of the push-pull circuit.

4. The inkjet printer according to claim 3, wherein:

the first transistor is a PNP transistor; and the second transistor is an NPN transistor.

5. The inkjet printer according to claim 1, wherein:

the drive signal generator includes a substrate including a circuit that generates the drive signal; and the cooling device is mounted on the substrate.

6. The inkjet printer according to claim 5, wherein the substrate has a structure that causes a total of amounts of heat generated by electronic components, when generating the drive signal, disposed adjacent to the first wall member, to be greater than a total of amounts of heat generated by electronic components, when generating the drive signal, disposed adjacent to the second wall member.

7. The inkjet printer according to claim 1, further comprising:

a carriage on which the one or more ink heads, the one or more drive signal generators, and the cooling device are mounted; and a conveyor that moves the carriage at least along a main scanning direction; wherein in the carriage, the first end and the second end of the first heat sink face each other in the main scanning direction.

8. The inkjet printer according to claim 7, wherein, in the carriage, the second wall member of the first heat sink is positioned closer to the one or more ink heads than the first wall member of the first heat sink.

9. The inkjet printer according to claim 7, further comprising a first partition plate provided in the carriage outwardly relative to the first wall member and arranged side by side with the first wall member.

10. The inkjet printer according to claim 7, further comprising a second partition plate provided in the carriage between the cooling device and the one or more ink heads.

11. The inkjet printer according to claim 1, further comprising:

a second cooling device including:

a second heat sink including wall members, a first end, and a second end, each of the wall members of the second heat sink including an outer wall, the second heat sink being arranged so that the first end of the second heat sink faces the second end of the first heat sink; and a second cooling fan including an inner air blowing portion, disposed so as to face the second end of the second heat sink, and an outer air blowing portion, disposed outwardly relative to the inner air blowing portion of the second heat sink, the second cooling fan directing air flow in a same direction as the air flow produced by the first cooling fan, at least through an interior of the second heat sink and along the outer wall of the first wall member of the second heat sink.

12. The inkjet printer according to claim 11, wherein a distance between the second end of the first heat sink and the first end of the second heat sink is less than a diameter of the second end of the first heat sink.

13. An inkjet print head comprising:

one or a plurality of heads including actuators that cause an ejection fluid to be ejected;

one or a plurality of drive signal generators that include a first electronic component and a second electronic component, and that generate a drive signal that drives the actuator; and a cooling device that cools at least the first electronic component and the second electronic component; wherein:

the first electronic component generates a greater amount of heat than the second electronic component when generating the drive signal;

the cooling device includes:

a heat sink including wall members, a first end, and a second end, the wall members including a first wall member and a second wall member each including an outer wall, the heat sink having a tubular shape defined by the wall members and being open at the first end and the second end; and a cooling fan including an inner air blowing portion, disposed so as to face the first end of the heat sink, and an outer air blowing portion, disposed outwardly relative to the inner air blowing portion, the cooling fan directing air flow at least through an interior of the heat sink and along the outer wall of the first wall member; wherein the first electronic component is in contact with the outer wall of the first wall member; and the second electronic component is in contact with the outer wall of the second wall member.

14. A three-dimensional printer comprising an inkjet print head according to claim 13.

* * * * *